United States Patent
Kumbaranthodiyil et al.

(10) Patent No.: US 10,862,502 B2
(45) Date of Patent: Dec. 8, 2020

(54) ADC OUTPUT DRIFT CORRECTION TECHNIQUES

(71) Applicant: Analog Devices International Unlimited Company, Limerick (IE)

(72) Inventors: Mahesh Madhavan Kumbaranthodiyil, Calicut (IN); Kirubakaran Ramalingam, Palakkad (IN)

(73) Assignee: Analog Devices International Unlimited Company, Limerick (IE)

( * ) Notice: Subject to any disclaimer, the term of this patent is extended or adjusted under 35 U.S.C. 154(b) by 0 days.

(21) Appl. No.: 16/691,256

(22) Filed: Nov. 21, 2019

(65) Prior Publication Data

US 2020/0287558 A1 Sep. 10, 2020

(30) Foreign Application Priority Data

Mar. 4, 2019 (IN) .............................. 201941008287

(51) Int. Cl.
*H03M 1/06* (2006.01)
*H03M 1/76* (2006.01)
*H03M 1/80* (2006.01)

(52) U.S. Cl.
CPC ........... *H03M 1/76* (2013.01); *H03M 1/0609* (2013.01); *H03M 1/808* (2013.01)

(58) Field of Classification Search
CPC .......................... H03M 1/0609; H03M 1/0612
USPC .......................................... 341/155, 120, 118
See application file for complete search history.

(56) References Cited

U.S. PATENT DOCUMENTS

| 4,491,825 | A | | 1/1985 | Tuthill |
| 4,990,797 | A | | 2/1991 | Real et al. |
| 5,294,927 | A | | 3/1994 | Levinson et al. |
| 5,351,268 | A | | 9/1994 | Jensen et al. |
| 5,488,368 | A | | 1/1996 | Brown et al. |
| 5,602,756 | A | | 2/1997 | Atwood et al. |
| 5,689,259 | A | | 11/1997 | Ozguc |
| 5,734,596 | A | * | 3/1998 | Medelius ............. G01D 18/004 330/124 R |
| 5,808,576 | A | | 9/1998 | Chloupek et al. |
| 5,909,244 | A | | 6/1999 | Waxman et al. |
| 6,897,713 | B1 | | 5/2005 | Nguyen et al. |
| 6,909,390 | B2 | | 6/2005 | Khoini-poorfard et al. |
| 6,924,759 | B2 | | 8/2005 | Wynne et al. |
| 6,962,436 | B1 | | 11/2005 | Holloway et al. |

(Continued)

OTHER PUBLICATIONS

Parguian, Joselito, "Building a Stable DAC External Reference Circuit", Texas Instruments Application Report SLAA172, (Mar. 2003), 10 pgs.

(Continued)

*Primary Examiner* — Peguy Jean Pierre
(74) *Attorney, Agent, or Firm* — Schwegman Lundberg & Woessner, P.A.

(57) ABSTRACT

Techniques are described that can be used to extract an offset and a gain of a signal chain, which can be used for digital correction of an analog-to-digital converter (ADC) output to help achieve a life time and temperature stable ADC output. For example, using various techniques, a value for a voltage reference VREF and a value for ground (GND) (or other reference voltage) can be converted, which can then be used to determine gain and offset, respectively, of the signal chain.

21 Claims, 3 Drawing Sheets

(56) References Cited

U.S. PATENT DOCUMENTS

| | | |
|---|---|---|
| 7,010,440 B1 | 3/2006 | Lillis et al. |
| 7,281,846 B2 | 10/2007 | Mcleod |
| 7,554,517 B2 | 6/2009 | Baum et al. |
| 7,648,271 B2 | 1/2010 | Doorenbos et al. |
| 7,710,302 B2 | 5/2010 | Iadanza et al. |
| 7,791,519 B2 | 9/2010 | Matsukawa et al. |
| 7,817,149 B2 | 10/2010 | Tsuge |
| 7,884,747 B2 | 2/2011 | Mclachlan |
| 7,948,418 B2 | 5/2011 | Cho et al. |
| 8,154,272 B2 | 4/2012 | Kim et al. |
| 8,154,433 B2 | 4/2012 | Mclachlan et al. |
| 8,237,596 B2 | 8/2012 | Zhao et al. |
| 8,476,971 B2 | 7/2013 | Peng et al. |
| 8,696,199 B2 | 4/2014 | St. Pierre et al. |
| 9,124,296 B2 | 9/2015 | Dempsey |
| 9,130,586 B1 | 9/2015 | Raz |
| 9,136,866 B2 | 9/2015 | Downey et al. |
| 9,300,318 B1 | 3/2016 | Medina Sanchez-Castro |
| 9,478,188 B1 | 10/2016 | Chang |
| 9,483,034 B2 | 11/2016 | Soenen et al. |
| 9,843,338 B1 | 12/2017 | Newlin |
| 10,056,915 B2 | 8/2018 | Onishi |
| 10,128,863 B2 | 11/2018 | Newlin |
| 10,389,375 B1 | 8/2019 | Fick et al. |
| 10,523,230 B2 | 12/2019 | Fick et al. |
| 2004/0102914 A1* | 5/2004 | More ............... H03M 1/1038 702/99 |
| 2006/0190210 A1 | 8/2006 | Mukherjee |
| 2007/0146058 A1 | 6/2007 | Jones |
| 2009/0160689 A1 | 6/2009 | Iadanza et al. |
| 2009/0323763 A1 | 12/2009 | Raychowdhury et al. |
| 2010/0002747 A1 | 1/2010 | Bosch et al. |
| 2010/0017164 A1* | 1/2010 | Wallin ............... G01L 25/003 702/104 |
| 2011/0156935 A1 | 6/2011 | Zhao et al. |
| 2012/0119930 A1* | 5/2012 | Kumar ............ H03F 3/45475 341/118 |
| 2018/0269888 A1 | 9/2018 | Newlin |
| 2019/0326921 A1 | 10/2019 | Fick et al. |

OTHER PUBLICATIONS

"U.S. Appl. No. 16/704,497, Ex Parte Quayle Action dated Jun. 16, 2020", 5 pgs.

"U.S. Appl. No. 16/704,497, Notice of Allowance dated Aug. 28, 2020", 7 pgs.

"U.S. Appl. No. 16/704,497, Response filed Aug. 7, 2020 to Ex Parte Quayle Action dated Jun. 16, 2020", 4 pgs.

* cited by examiner

ADC OUTPUT DRIFT CORRECTION TECHNIQUES

CLAIM OF PRIORITY

This application claims the benefit of priority of Indian Provisional Patent Application Number 201941008287, titled "ADC OUTPUT TEMPERATURE DRIFT CORRECTION AND FORCING AND SENSING DACS SHARING REFERENCE VOLTAGE" to Mahesh Madhaven, et al. and filed on Mar. 4, 2019 in the India Patent Office, the entire contents of which being incorporated herein by reference.

FIELD OF THE DISCLOSURE

This document pertains generally, but not by way of limitation, to analog-to-digital converters.

BACKGROUND

In the field of optical communication, data is converted into light waves by photodiodes. The photodiodes can be operated at a given wavelength, which in turn is directly dependent up on temperature. To achieve optimum performance, the operating temperature of the photodiode should be kept constant.

SUMMARY

This disclosure describes various techniques to extract offset drift and gain drift of a signal chain, which can be used for digital correction of an analog-to-digital converter (ADC) output to help achieve a life time and temperature stable ADC output. More particularly, various techniques of this disclosure can convert a value for a voltage reference VREF and a value for ground (GND) (or other reference voltage) that can be used to determine gain and offset, respectively, of the signal chain.

In some aspects, this disclosure is directed to a method of correcting a gain drift and an offset drift of a signal chain so as to achieve a temperature stable analog-to-digital converter (ADC) output signal of an ADC circuit, the method comprising: determining first and second digital codes representing corresponding first and second reference voltages; determining the gain drift and the offset drift of the ADC circuit using the first and second digital codes; and correcting the gain drift and the offset drift of the ADC circuit.

In some aspects, this disclosure is directed to a circuit for correcting a gain drift and an offset drift of a signal chain so as to achieve a temperature stable analog-to-digital converter (ADC) output signal of an ADC circuit, the circuit comprising: the ADC circuit, configured to determine first and second digital codes representing corresponding first and second reference voltages; and a digital processing circuit coupled to the ADC circuit and configured to: determine the gain drift and the offset drift of the ADC circuit using the first and second digital codes; and correct the gain drift and the offset drift of the ADC circuit.

In some aspects, this disclosure is directed to a circuit for correcting a gain drift and an offset drift of a signal chain so as to achieve a temperature stable analog-to-digital converter (ADC) output signal of an ADC circuit, the circuit comprising: means for determining first and second digital codes representing corresponding first and second reference voltages; and a digital processing circuit coupled to the ADC circuit and configured to: determine the gain drift and the offset drift of the ADC circuit using the first and second digital codes; and correct the gain drift and the offset drift of the ADC circuit.

This overview is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

In the field of optical communication, data can be converted into light waves by photodiodes. To achieve the best photodiode performance, the photodiodes should be operated at a given wavelength that, in turn, is directly dependent upon temperature. To achieve the best performance, an operating temperature of the photodiode should be kept constant. Hence, there should be a mechanism to measure the temperature very accurately.

Initial accuracy may not be important as the biasing scheme of the photodiode can find the optimum wavelength at the factory. Once the optical module is in the field, however, the present inventors have recognized a need to be able to accurately measure a drift in the operating temperature of the photodiode. In a non-limiting specific example implementation, the drift can be measured to an accuracy level of 0.05 degrees Celsius.

The present inventors have recognized that various techniques of this disclosure can be used to extract an offset and a gain of a signal chain, which can be used for digital correction of an analog-to-digital converter (ADC) output to help achieve a life time and temperature stable ADC output. For example, using various techniques of this disclosure, a value for a voltage reference VREF and a value for ground (GND) (or other reference voltage) can be converted, which can then be used to determine gain and offset, respectively, of the signal chain.

Figure 1:
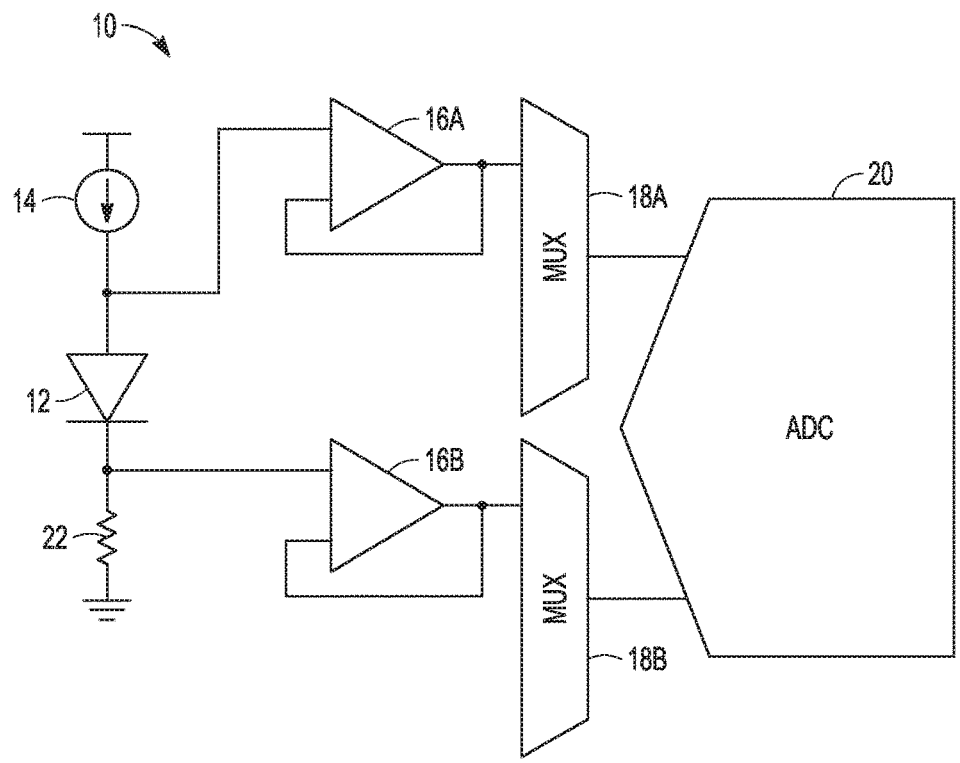
FIG. 1 is an example of a simplified signal chain for converting a base-emitter voltage of a diode.

FIG. 1 is an example of a simplified signal chain for converting a base-emitter voltage of a diode. The circuit 10 of FIG. 1 can include a diode 12, a current source 14, first and second buffer amplifiers 16A, 16B coupled across the diode 12, first and second multiplexors ("MUX") 18A, 18B coupled to corresponding outputs of the buffers 16A, 16B, and a differential ADC 20, e.g., a successive approximation register (SAP.) ADC or sigma-delta ADC, coupled to receive at its two inputs the outputs of each of the first and second multiplexors 18A, 18B. A parasitic resistance 22 is also depicted, which is ideally zero ohms. In FIG. 1, the diode 12 can be forward biased and can change with temperature.

The operating temperature of a photodiode can be found by converting the base-emitter voltage (VBE) of a diode 12 placed very close to the photodiode. The circuit 10 of FIG. 1 differentially measures the voltage drop across the diode 12 and can convert that measurement into the digital domain using the ADC 20, which can be used to determine the VBE voltage of the diode 12. The determined VBE voltage can provide a representation of the temperature of the diode.

The major sources of drift at the ADC output can include the offset drift along the signal chain, the gain drift along the signal chain, the integral non-linearity (INL) drift along the signal chain, pad leakage current drift, noise, and open loop gain drift of the buffers in the signal chain.

The offset drift can cancel because the ΔVBE is a difference between two ADC measurements. The INL drift for the ADC over life time/temperature over the span of 0.1 volt (V) (VBE(32I)-VBE(I)) is around one least significant bit (LSB) which corresponds to 0.01 LSB, which is not a major contributor to the drift.

The drift due to pad ESD leakage can be made insignificant by using low leakage ESD cells and leakage current compensation. The drift due to noise can be made insignificant by averaging over 1000 samples. The drift due to amplifier open loop gain can be made insignificant by designing open loop gain of the buffer to be >>120 db.

The gain drift with temperature of the ADC over its full span is around +/−25 LSB. Referring to the specific non-limiting example described above where an accuracy of 0.05 C is desired, this drift corresponds to 2.5 LSB over 0.1V span of ΔVBE, which corresponds to 0.2 C temperature drift, or four times the allowed drift of 0.050.

The gain drift with the lifetime over the full span of the ADC could be around +/−10 LSB. This drift corresponds to 0.4 LSB over 0.1V span of ΔVBE, which corresponds to 0.05 C temperature drift, or which is 100% of the allowed drift 0.05 C.

Using various techniques of this disclosure, a gain drift (or error) of an ADC can be extracted so that any drift on the gain can be determined and the ADC output can be adjusted accordingly.

Figure 2:
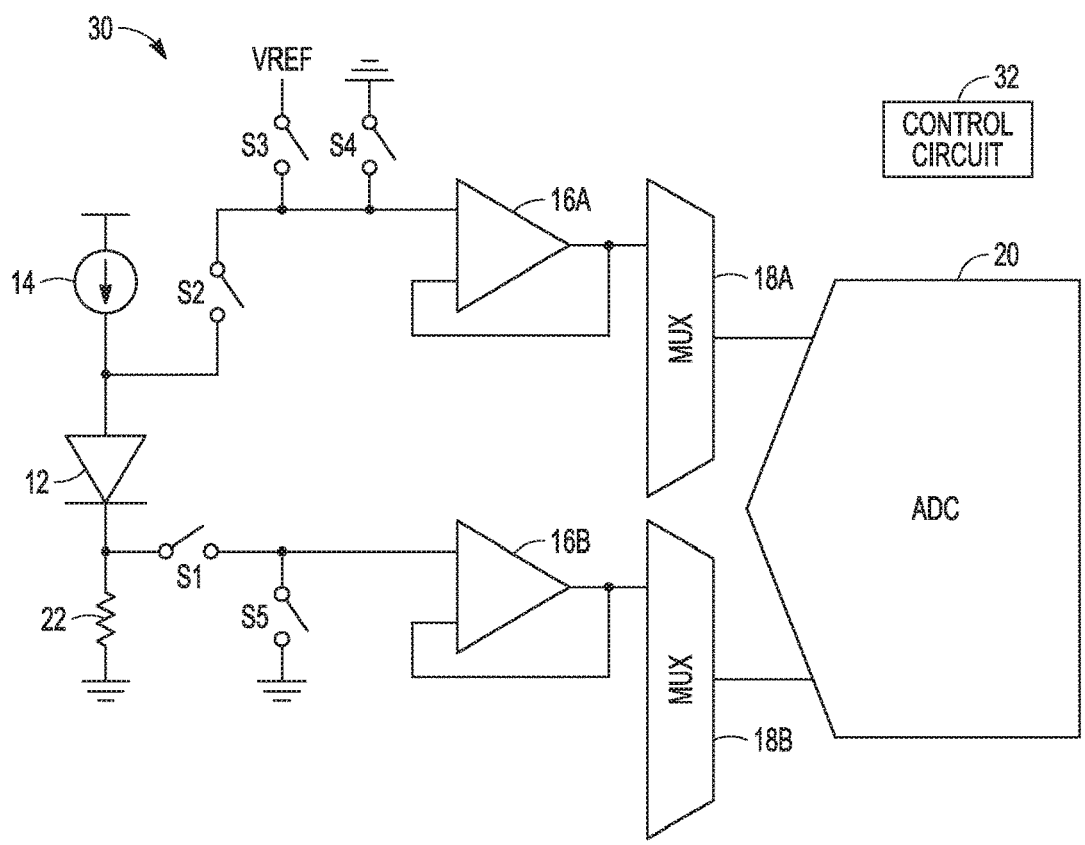
FIG. 2 is an example of a simplified calibration measurement signal chain that can extract an offset and a gain of a signal chain, which can be used for digital correction of an analog-to-digital converter (ADC) output to help achieve a life time and temperature stable ADC output.

FIG. 2 is an example of a simplified calibration measurement signal chain of a circuit that can extract an offset and a gain of a signal chain, which can be used for digital correction of an analog-to-digital converter (ADC) output to help achieve a life time and temperature stable ADC output. Components in FIG. 2 that are similar to components in FIG. 1 are labeled with similar reference numbers and, for purposes of conciseness, will not be described in detail again.

The signal chain 30 of FIG. 2 includes various switches S1-S5. By controlling various ones of the switches S1-S5, the circuit 30 can convert a value for a voltage reference VREF and a value for ground (GND) that can be used to determine gain drift and offset drifts, respectively, of the signal chain. Then, using the determined gain drift and offset drift values, digital post-processing can adjust an output of the ADC to ensure that its accurate. Although the techniques of this disclosure are described with respect to ground potential (GND), any potential other than the reference voltage (VREF) can be used.

As mentioned above, a determined VBE voltage of the diode 12 can provide a representation of the temperature of the diode. As such, a differential measurement of the diode can be considered to be a temperature sensor measurement, which can be applied to the ADC 20 on a first channel (shown in FIG. 3 as a "Tempsensor" input 0 to MUX 18A).

It should be understood that although the techniques are described with respect to temperature sensors, the techniques of this disclosure are not limited to temperature sensors. The techniques of this disclosure can be used with any sensor where it is desirable to have low gain drift and low offset drift.

Figure 3:
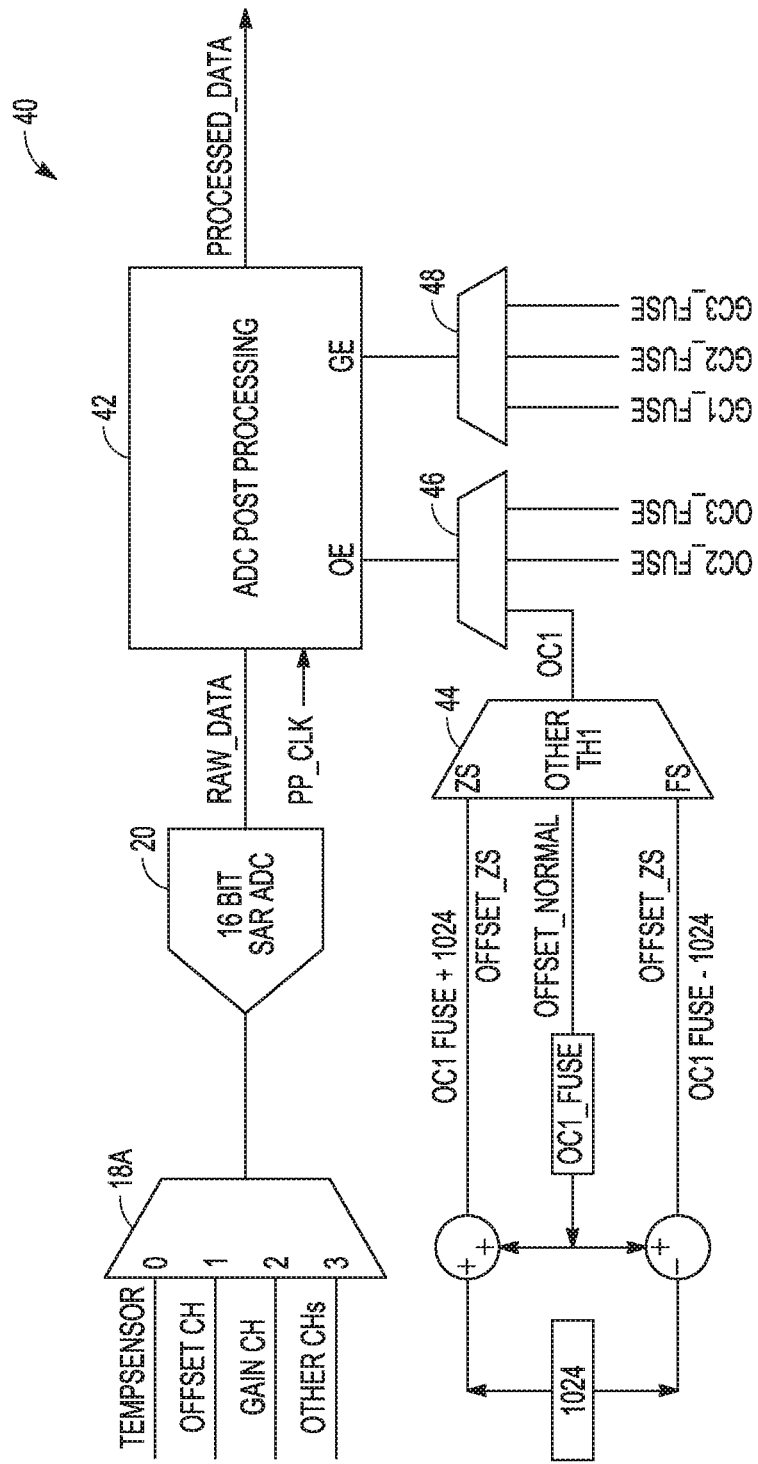
FIG. 3 is a block diagram of an example of a simplified calibration measurement signal chain that can extract an offset and a gain of a signal chain, which can be used for digital correction of an analog-to-digital converter (ADC) output to help achieve a life time and temperature stable ADC output.

The GND voltage of the signal chain 30 can be applied to the ADC 20 on a second channel (shown in FIG. 3 as an offset channel ("Offset Ch") input 1 to MUX 18A). The second channel can use a second pair of buffer amplifiers (not shown in FIG. 2).

The reference voltage VREF of the signal chain 30 can be applied to the ADC 20 on a third channel (shown in FIG. 3 as a gain channel ("Gain Ch") input 2 to MUX 18A). The third channel can use a third pair of buffer amplifiers (not shown in FIG. 2).

During calibration, the configuration measurement signal chain 30 of FIG. 2 can be disconnected from the external diode. Table 1 (below) depicts the modes of operation and the switches that are ON and the switches that are OFF for those modes of operation.

TABLE 1

| Mode of operation | Switches turned on | Switches turned off |
| --- | --- | --- |
| Conversion of diode anode | S2 | S1, S3, S4, S5 |
| Conversion of diode cathode | S1 | S2, S3, S4, S5 |
| Conversion of VREF (e.g., FSOUT) | S3, S5 | S1, S2, S4 |
| Conversion of GND (e.g., ZSOUT) | S4, S5 | S1, S2, S3 |

As an example, to determine a conversion of a measurement of a voltage at the anode of the diode 12, a first current can be applied via the current source 14, a control circuit 32 can control switch S2 to turn ON and can control switches S1 and S3-S5 to turn OFF and a first VBE measurement can be determined. Then, to determine a conversion of a measurement of a voltage at the cathode of the diode, a second current can be applied via the current source 14, the control circuit 32 can control switch S1 to turn ON and switches S2-S5 to turn OFF and a second VBE measurement can be determined. Using these measurements, ADC post-processing techniques can determine a temperature insensitive measurement.

In addition, by controlling various ones of the switches S1-S5, the circuit 30 can convert a value for a first reference voltage VREF, e.g., 2.5V, to a first digital code (FSOUT) and convert a value for second reference voltage, e.g., ground (GND) or some other reference potential, to a second digital code (ZSOUT) that can be used to determine gain and offset drift, respectively, of the signal chain. For example, to convert the reference voltage VREF to determine the gain drift, the control circuit 32 can control switches S3 and S5 to turn ON and switches S1, S2, and S4 to turn OFF. The buffered reference voltage VREF can be applied to a third channel of the MUX 18A and then to the positive input of the ADC 20, and the GND voltage can be applied to a third channel of the MUX 18B and then to the negative input of the ADC 20. The ADC 20 can output a first digital code representing the full-scale output (FSOUT).

To convert the voltage GND to determine the offset drift, the control circuit 32 can control switches S4 and S5 to turn ON and switches S1-S3 to turn OFF. The GND voltage toward the top of FIG. 3 can be applied to a second channel of the MUX 18A and then to the positive input of the ADC 20, and the GND voltage toward the bottom of FIG. 3 can be applied to a second channel of the MIA 18B and then to the negative input of the ADC 20. The ADC 20 can output a second digital code representing the zero-scale output (ZSOUT).

The VREF and GND measurements can be converted b the ADC 20 and the ADC gain drift (or error) can be determined using these two outputs as described below with respect to FIG. 3.

FIG. 3 is a block diagram of an example of circuit for correcting a gain drift and an offset drift of a signal chain so as to achieve a temperature stable analog-to-digital converter (ADC) output signal of an ADC circuit. The circuit can extract an offset and a gain of the signal chain, which can be used for digital correction of the ADC output to help achieve a life time and temperature stable ADC output. Components in FIG. 3 that are similar to components in FIGS. 1 and 2 are labeled with similar reference numbers and, for purposes of conciseness, will not be described in detail again.

The simplified signal chain 40 of FIG. 3 depicts multiplexor 18A of FIG. 2 coupled to an input of the ADC 20 of FIG. 2. In addition, the signal chain 40 of FIG. 3 can include an ADC post-processing circuit 42 to receive raw measurement data that can include the measurements of the diode 12 of FIG. 2 as well as the gain measurements and the offset measurements. The ADC post-processing circuit 42 can include multiple stages: a linearity correction stage, a gain/offset correction stage, and a clipping correction stage. The ADC post-processing circuit 42 can output a processed digital value.

The ADC post-processing circuit 42 can receive one or more sets of fixed offset coefficients at its offset error (OE) input using a multiplexor 44, and can receive one or more gain error coefficients at its gain error (GE) input. For example, a zero scale (ZS) offset ("Offset_ZS") coefficient, a normal offset ("Offset_Normal") coefficient, and a full scale (FS) offset ("Offset_FS") coefficient can be applied to the offset error (OE) input of the ADC post-processing circuit 42. These coefficients can be determined during factory testing and can be burned into the chip using fuses, e.g., polysilicon fuses. Other offset coefficients can be determined during factor testing and can be burned into the chip. These offset coefficients are depicted as "OC2_fuse", and "OC3_fuse" and can be applied to the gain error (GE) input of the ADC post-processing circuit 42 via a MUX 46.

Similarly, the gain coefficients can be determined during factor testing and can be burned into the chip. These are depicted as "GC1_fuse", "GC2_fuse", and "GC3_fuse" and can be applied to the gain error (GE) input of the ADC post-processing circuit 42 via a MUX 48. For each conversion, the offset and gain coefficients can be used.

As an example, for an ideal 16-bit ADC without drift, the ADC output will be 65535 LSBs while converting the reference VREF (Channel 3) and the ADC output will be 0 least significant bits (LSBs) for GND (Channel 2). In the presence of offset and gain drift of the ADC, these results can also drift. For example, while converting the reference VREF (Channel 3), the ADC output can be 65535+/−(gain at full scale+offset) drift in the LSBs. While converting the GND voltage (Channel 2), the ADC output can be 0+/−offset drift in the LSBs.

In the digital domain, as a final step in post processing, the output data could be clipped such that any digital code above 65535 is clipped to 65535 and any digital code less than 0 is clipped to 0. This means that the results will be incorrect if the value of the (gain at full scale+offset) drifts in the positive direction and/or the offset drifts in the negative direction.

To reduce or eliminate clipping issues, the calibration techniques of this disclosure can implement the following technique. By way of a non-limiting example, for a reference voltage VREF conversion, a constant or fixed negative offset of 1024 LSB can be provided in the digital domain to the gain channel (channel 3) before clipping. For a GM) conversion, a constant or fixed positive offset of 1024 LSB can be provided in the digital domain before clipping. In some example implementations, there is no change to the gain correction coefficients in the post processing.

It should be noted that the fixed offset value of 1024 LSB is based on the redundancy of the ADC 20. For a particular 16-bit ADC 20, there can be 1024 LSB of offset, which is based on the number of redundant bit weights in the ADC, e.g., a successive approximation register (SAR) ADC. An example SAR ADC is described in commonly assigned U.S. Pat. No. 7,432,844 to Mueck et al. and titled "DIFFERENTIAL INPUT SUCCESSIVE APPROXIMATION ANALOG TO DIGITAL CONVERTER WITH COMMON MODE REJECTION," the entire contents of which being incorporated herein by reference. In some examples, the fixed offset value, e.g., 102.4 LSB, can be a value that is less than the sum of the redundant bit weights of the ADC, e.g., half the number of redundant bit weights. Other ADCs can have a different number of redundant bit weights and thus different LSB offset values. Thus, this disclosure is not limited to configurations with an offset value of 1024 LSB.

The ADC post-processing circuit 42 can use Equations (1) and (2) below to determine the gain and offset drift from the full scale (FS) and zero scale (ZS) errors. The numbers in Equations (1) and (2) are for purposes of explanation only and are non-limiting. In ADC circuit configurations with different bit resolutions, the numbers in Equations (1) and (2) can be different.

The ADC digital output code when converting full scale (FSOUT), e.g., VREF (or some other reference voltage), is given by Equation (1) below:

$$65535 \text{ (ideal output)} +/- \text{(gain drift)} +/- \text{(offset drift)} - 1024 \text{ (fixed offset)} \quad \text{Eq. (1)}$$

For Equation (1), in FIG. 3 the gain drift can be determined from the measurements of the gain channel 2 ("Gain Ch") using Equation 3 below, the offset drift can be determined from the measurements of the offset channel 1 ("Offset Ch") using Equation (4) below, and the 65535 (ideal output)-1024 can be determined by selecting the full scale offset value "Offset_FS" applied to the offset error (OE) input of the ADC post-processing circuit 42.

The ADC digital output code when converting zero scale (ZSOUT), e.g., using ground potential (or some other reference voltage) is given by Equation (2) below:

$$0 \text{ (ideal output)} +/- \text{(offset drift)} + 1024 \text{ (fixed offset)} \quad \text{Eq. (2)}$$

For Equation (2), in FIG. 3 the offset drift can be determined from the measurements of the offset channel 1 ("Offset Ch"), and the term "0 (ideal output)+1024" can be determined by selecting the zero scale offset value "Offset_ZS" applied to the offset error (OE) input of the ADC post-processing circuit 42.

In some example implementations, to determine the gain drift in the specific non-limiting example described above, the ADC post-processing circuit 42 can subtract the two results of Equations (1) and (2) and further subtract (65535−2*1024):

$$\text{gain drift} = FSOUT - ZSOUT - 65535 - 2048. \quad \text{Eq. (3)}$$

In other words, the gain drift in Equation (3) can be determined by determining a difference between a first digital code when converting full scale (FSOUT) and a second digital code when converting zero scale (ZSOUT), and combining an ideal full-scale output term, e.g., 65535 for a 20-bit ADC, and an offset term, e.g., 2048, which can be twice the fixed offset value, 2*1024, with the difference.

In some example implementations, to determine the offset drift in the specific non-limiting example described above, the ADC post-processing circuit 42 can subtract 1024 from the zero-scale measurement:

$$\text{offset drift} = ZSOUT - 1024. \quad \text{Eq. (4)}$$

In other words, the offset drift in Equation (4) can be determined by subtracting the offset value. e.g., 1024 for the non-limiting configuration above, from the second code when converting zero scale (ZSOUT).

In some example implementations, the initial gain/offset error can be determined at the factory and saved, set by fuses. Then, when in use, the field gain and offset drift values can be determined periodically using the techniques described above, and corrections can be applied accordingly to the ADC output. For example, the gain and offset drift values can be stored in memory and corrected digitally using the ADC post-processing circuit 42.

The periodicity of the gain/offset measurements can be determined using a user setting and can be set to be performed as often as desired.

In this manner, the offset/gain of the entire signal chain can be calculated in real time so that gain/offset correction can be applied to all the normal outputs except for the VREF/GND conversion, which will result in a temperature/life time stable ADC output.

Figure 4:
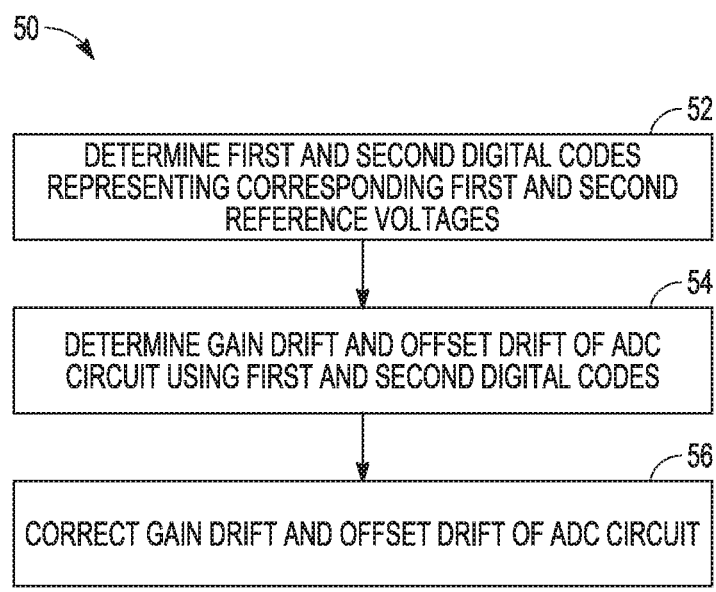
FIG. 4 is a flow diagram depicting an example of a method of correcting a gain drift and an offset drift of a signal chain so as to achieve a temperature stable analog-to-digital converter (ADC) output signal of an ADC circuit using various techniques of this disclosure.

FIG. 4 is a flow diagram depicting an example of a method 50 of correcting a gain drift and an offset drift of a signal chain so as to achieve a temperature stable analog-to-digital converter (ADC) output signal of an ADC circuit using various techniques of this disclosure. At block 52, the method 50 can include determining first and second digital codes representing corresponding first and second reference voltages. For example, the first digital code and be a full scale output (FSOUT) corresponding to a first reference voltage, such as VREF, and the second digital code can be a zero scale output (ZSOUT) representing a second reference voltage, such as ground or other reference potential.

In some examples, determining the first digital code, e.g., FSOUT, representing the first reference voltage, e.g., VREF, can include coupling the first reference voltage to a first input of the ADC circuit and coupling the second reference voltage to a second input of the ADC circuit. For example, as shown in FIG. 2 and Table 1, to convert the reference voltage VREF to determine the gain drift, the control circuit 32 can control switches S3 and S5 to turn ON and switches S1, S2, and S4 to turn OFF. The buffered reference voltage VREF can be applied to a third channel of the MUX 18A and then to the positive input of the ADC 20, and the GND voltage can be applied to a third channel of the MUX 18B and then to the negative input of the ADC 20. The ADC 20 can output a first digital code representing the full-scale output (FSOUT).

In some examples, determining the second digital code, e.g., ZSOUT, representing the second reference voltage, e.g., ground, can include coupling the second reference voltage to first and second inputs of the ADC circuit. For example, as shown in FIG. 2 and Table 1, to convert the voltage GND to determine the offset drift, the control circuit 32 can control switches S4 and S5 to turn ON and switches S1-S3 to turn OH. The GND voltage toward the top of FIG. 3 can be applied to a second channel of the MUX 18A and then to the positive input of the ADC 20, and the GND voltage toward the bottom of FIG. 3 can be applied to a second channel of the MUX 18B and then to the negative input of the ADC 20. The ADC 20 can output a second digital code representing the zero-scale output (ZSOUT).

At block 54, the method 50 can include determining the gain drift and the offset drift of the ADC circuit using the first and second digital codes. For example, determining the gain drift of the ADC circuit can include determining a difference between the first code and the second code and combining a code representing an ideal full-scale output value and a code representing an offset term with the difference. As a non-limiting specific example, the gain drift can be represented by. Equation (3) above, where the gain drift=FSOUT−ZSOUT−65535−2048. A control circuit, e.g., control circuit 32 of FIG. 2, can determine a difference between the first code and the second code, FSOUT−ZSOUT, and combine a code representing the ideal full-scale output value, e.g., 65535 in a non-limiting example, and a code representing an offset term, e.g., 2048 in a non-limiting example, with the difference.

As an example, determining the offset drift of the ADC circuit can include determining a difference between the second code and a code representing a fixed offset value. As a non-limiting specific example, the offset drift can be represented by Equation (4) above, where the offset drift=ZSOUT−1024. For example, the offset drift in Equation (4) can be determined by subtracting a fixed offset value, e.g., 1024 for the non-limiting configuration above, from the second code when converting zero scale (ZSOUT). In some examples, the code representing the fixed offset value, e.g., 1024, is based on a number of redundant bit weights in the ADC circuit.

In some examples, determining the gain drift and the offset drift of the ADC circuit using the first and second digital codes at block 54 can include receiving a code representing a full-scale offset value, and receiving a code representing a zero-scale offset value. For example, the ADC post-processing circuit 42 of FIG. 3 can receive a zero scale (ZS) offset ("Offset_ZS") coefficient, a normal offset ("Offset_Normal") coefficient, and a full scale (FS) offset ("Offset_FS") coefficient to the offset error (OE) input of the ADC post-processing circuit 42, e.g., via mux 44.

At block 56, the method 50 can include correcting the gain drift and the offset drift of the ADC circuit. For example, the ADC post-processing circuit 42 of FIG. 3 store codes representing the determined gain drift and offset drift of the ADC circuit. Then, to correct the gain drift and the offset drift of the ADC circuit, the ADC post-processing circuit 42 of FIG. 3 can retrieve the codes representing the determined gain drift and offset drift of the ADC circuit and apply the retrieved codes to an output code of the ADC circuit.

Notes

The above description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Geometric terms, such as "parallel", "perpendicular", "round", or "square", are not intended to require absolute mathematical precision, unless the context indicates otherwise. Instead, such geometric terms allow for variations due to manufacturing or equivalent functions. For example, if an element is described as "round" or "generally round," a component that is not precisely circular (e.g., one that is slightly oblong or is a many-sided polygon) still encompassed by this description.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 CFR, § 1.72(b), to allow the reader to quickly, ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment.

The claimed invention is:

1. A method of correcting a gain drift and an offset drift of a signal chain so as to achieve a temperature stable analog-to-digital converter (ADC) output signal of an ADC circuit, the method comprising:
   determining first and second digital codes representing corresponding first and second reference voltages, wherein determining the first digital code representing the first reference voltage includes:
      coupling the first reference voltage to a first input of the ADC circuit; and
      coupling the second reference voltage to a second input of the ADC circuit;
   determining the gain drift and the offset drift of the ADC circuit using the first and second digital codes; and
   correcting the gain drift and the offset drift of the ADC circuit.

2. The method of claim 1, wherein determining the second digital code representing the second reference voltage includes:
   coupling the second reference voltage to first and second inputs of the ADC circuit.

3. The method of claim 1, wherein determining the gain drift of the ADC circuit includes:
   determining a difference between the first code and the second code; and
   combining a code representing an ideal full-scale output value and a code representing an offset term with the difference.

4. The method of claim 1, wherein determining the offset drift of the ADC circuit includes:
   determining a difference between the second digital code and a code representing a fixed offset value.

5. The method of claim 4, wherein the code representing the fixed offset value is based on a number of redundant bit weights in the ADC circuit.

6. The method of claim 5, wherein the fixed offset value is less than a sum of redundant bit weights of the ADC.

7. The method of claim 1, wherein determining the gain drift and the offset drift of the ADC circuit using the first and second digital codes further includes:
   receiving a code representing a full-scale offset value; and
   receiving a code representing a zero-scale offset value.

8. The method of claim 1, comprising:
   storing codes representing the determined gain drift and offset drift of the ADC circuit,
   wherein correcting the gain drift and the offset drift of the ADC circuit includes:
   retrieving the codes representing the determined gain drift and offset drift of the ADC circuit and applying the retrieved codes to an output code of the ADC circuit.

9. A circuit for correcting a gain drift and an offset drift of a signal chain so as to achieve a temperature stable analog-to-digital converter (ADC) output signal of an ADC circuit, the circuit comprising:

the ADC circuit, configured to determine first and second digital codes representing corresponding first and second reference voltages;

a digital processing circuit coupled to the ADC circuit and configured to:
   determine the gain drift and the offset drift of the ADC circuit using the first and second digital codes; and
   correct the gain drift and the offset drift of the ADC circuit;

a control circuit; and a plurality of switches, wherein, to determine the first digital code representing the first reference voltage, the control circuit is configured to:
   operate at least one of the switches to couple the first reference voltage to a first input of the ADC circuit; and
   operate at least one of the switches to couple the second reference voltage to a second input of the ADC circuit.

10. The circuit of claim 9, wherein, to determine the second digital code representing the second reference voltage, the control circuit is configured to:
   operate at least one of the switches to couple the second reference voltage to first and second inputs of the ADC circuit.

11. The circuit of claim 9, wherein the digital processing circuit configured to determine the gain drift of the ADC circuit is configured to:
   determine a difference between the first digital code and the second digital code; and
   combine a code representing an ideal full-scale output value and a code representing an offset term with the difference.

12. The circuit of claim 9, wherein the digital processing circuit configured to determine the offset drift of the ADC circuit is configured to:
   determine a difference between the second digital code and a code representing a fixed offset value.

13. The circuit of claim 9, wherein the code representing the fixed offset value is based on a number of redundant bit weights in the ADC circuit.

14. The circuit of claim 13, wherein the fixed offset value is less than a sum of redundant bit weights of the ADC.

15. The circuit of claim 9, wherein the digital processing circuit configured to determine the gain drift and the offset drift of the ADC circuit using the first and second digital codes is configured to:
   receive a code representing a full-scale offset value, and
   receive a code representing a zero-scale offset value.

16. The circuit of claim 9, wherein the digital processing circuit is configured to:
   store codes representing the determined gain drift and offset drift of the ADC circuit, and
   wherein the digital processing circuit configured to correct the gain drift and the offset drift of the ADC circuit is configured to:
   retrieve the codes representing the determined gain drift and offset drift of the ADC circuit and apply the retrieved codes to an output code of the ADC circuit.

17. A circuit for correcting a gain drift and an offset drift of a signal chain so as to achieve a temperature stable analog-to-digital converter (ADC) output signal of an ADC circuit, the circuit comprising:
   means for determining first and second digital codes representing corresponding first and second reference voltages; and
   a digital processing circuit coupled to the ADC circuit and configured to:
      determine the gain drift and the offset drift of the ADC circuit using the first and second digital codes; and
      correct the gain drift and the offset drift of the ADC circuit,
   wherein the digital processing circuit configured to determine the gain drift of the ADC circuit is configured to:
      determine a difference between the first and second digital codes; and
      combine a code representing an ideal full-scale output value and a code representing an offset term with the difference.

18. The circuit of claim 17, wherein the digital processing circuit configured to determine the offset drift of the ADC circuit is configured to:
   determine a difference between the second digital code and a code representing a fixed offset value.

19. The circuit of claim 17, wherein the digital processing circuit is configured to:
   store codes representing the determined gain drift and offset drift of the ADC circuit, and
   wherein the digital processing circuit configured to correct the gain drift and the offset drift of the ADC circuit is configured to:
   retrieve the codes representing the determined gain drift and offset drift of the ADC circuit and applying the retrieved codes to an output code of the ADC circuit.

20. The circuit of claim 17, wherein the code representing the fixed offset value is based on a number of redundant bit weights in the ADC circuit.

21. The circuit of claim 20, wherein the fixed offset value is less than a sum of redundant bit weights of the ADC.

* * * * *